United States Patent [19]

Itoh

[11] Patent Number: 5,138,273
[45] Date of Patent: Aug. 11, 1992

[54] FM DEMODULATOR

[75] Inventor: Hiroya Itoh, Yokohama, Japan

[73] Assignee: Kabushiki Kaisha Toshiba, Kanagawa, Japan

[21] Appl. No.: 688,606

[22] PCT Filed: Oct. 4, 1990

[86] PCT No.: PCT/JP90/01284
§ 371 Date: Jun. 5, 1991
§ 102(e) Date: Jun. 5, 1991

[30] Foreign Application Priority Data

Oct. 6, 1989 [JP] Japan ................... 1-261561

[51] Int. Cl.$^5$ ............................................. H03D 3/00
[52] U.S. Cl. ................................... 329/315; 329/318; 329/327
[58] Field of Search ............... 329/315, 318, 327; 307/519; 328/140; 455/214, 337

[56] References Cited

U.S. PATENT DOCUMENTS 3,783,398 1/1974 Dann ............................ 329/327
4,843,339 6/1989 Burt et al. .................... 330/10

FOREIGN PATENT DOCUMENTS 58-172005 10/1983 Japan.
61-145905 7/1986 Japan.
64-67012 3/1989 Japan.

Primary Examiner—David Mis
Attorney, Agent, or Firm—Finnegan, Henderson, Farabow, Garrett and Dunner

[57] ABSTRACT

In an FM demodulator which is used in a video tape recorder and in which the linearity of input/output signals is not easily assured to increase a demodulation enable frequency, an FM signal is supplied to the base of a first transistor constituting a first differential amplifier, and a constant voltage is input to the base of a second transistor. A constant voltage is applied to the base of a third transistor constituting a second differential amplifier, and an FM signal having a phase opposite to the FM signal supplied to the first transistor is supplied to the base of a fourth transistor. A capacitor is connected between the emitters of the first and second transistors and the emitters of the third and fourth transistors. A first constant current circuit is arranged between the emitters of the first and second transistors, and a second constant current circuit having a current value twice that of the first constant current circuit is arranged between the emitters of the third and fourth transistors.

9 Claims, 4 Drawing Sheets

FM DEMODULATOR

TECHNICAL FIELD

The present invention relate to an FM demodulator used in, e.g, a VTR (Video Tape Recorder) and, more particularly, to an FM demodulator used for demodulating a reproduction signal.

BACKGROUND ART

FIG. 5 shows a conventional FM demodulator.

An FM signal reproduced by a reproduction head of a VTR (not shown) and converted into a square wave by a limiter circuit is supplied to an input terminal 11, and an FM signal having a phase opposite to that of the FM signal input to the input terminal 11 is supplied to an input terminal 12.

A first differential amplifier DA1 includes transistors Q1 and Q2. The base of the transistor Q1 is connected to the input terminal 11. The collector of the transistor Q1 is connected to the positive terminal of a power source $V_{CC}$, and the emitter of the transistor Q1 is connected together with the emitter of the transistor Q2 to the negative terminal of the power source $V_{CC}$ through a first constant current circuit 13. The collector of the transistor Q2 is connected to the positive terminal of the power source $V_{CC}$, and the base of the transistor Q2 is connected to the positive terminal of a power source $V_{BB}$ and the base of a transistor Q3. The negative terminal of the power source $V_{BB}$ is connected to the negative terminal of the power source $V_{CC}$.

A differential amplifier DA2 includes the transistor Q3 and a transistor Q4. The collector of the transistor Q3 is connected together with the emitter of the transistor Q4 to the positive terminal of the power source $V_{CC}$, and the emitter of the transistor Q3 is connected to the negative terminal of the power source $V_{CC}$ through a second constant current circuit 14. A current value $I_2$ of the second constant current circuit 14 is set to be equal to a current value $I_1$ of the first constant current circuit 13. In addition, a capacitor C is connected between the emitters of the transistors Q1 and Q2 and the emitters of the transistors Q3 and Q4.

The base of the transistor Q4 is connected to 1 input terminal 12, and the collector of the transistor Q4 is connected to the positive terminal of the power source $V_{CC}$ through a resistor R and to the non-inverting input terminal of a voltage comparator 15. The non-inverting input terminal of the voltage comparator 15 is connected to the negative terminal of the power source $V_{CC}$ through a reference power source Vref, and the output terminal of the voltage comparator 15 is connected to an output terminal through a low-pass filter LPF. The reference power source Vref is set by the following equation:

$$Vref = V_{CC} - 1.5 \, RI_1$$

An operation of the demodulator with the above arrangement will be described below with reference to FIG. 6.

An FM signal indicated by reference symbol $V_A$ in FIG. 6 is supplied to the input terminal 11, and an FM signal indicated by reference symbol $V_B$ in FIG. 6 and having a phase opposite to that of the FM signal $V_A$ is supplied to the input terminal 12.

When the transistor Q1 is turned on at the leading edge of the FM signal VA indicated by ①  in FIG. 6, a collector current ($I_A = 2I_1$) of the transistor Q1 flows through the first constant current circuit 13, the capacitor C, and the second constant current circuit 14. When a voltage $V_E$ becomes a voltage indicated by ② in FIG. 6, the transistor Q3 is turned on, collector currents ($I_C = I_1 = I_2$ and $I_A = I_1$) of the transistors Q3 and Q1 flow through the second and first constant current circuits 14 and 13, respectively.

When a opposite-phase FM signal $V_B$ rises as indicated by ③ and the transistor Q4 is turned on, a collector current ($I_D = 2I_1$) of the transistor Q4 flows through the second constant current circuit 14, the capacitor C, and the first constant current circuit 13. When a voltage $V_D$ of the capacitor C becomes a voltage indicated by ④ in FIG. 6, the transistor Q2 is turned on, and the collector currents ($I_B = I_1$ and $I_D = I_1$) of the transistors Q2 and Q4 flow through the first and second constant current circuits 13 and 14, respectively.

The voltage comparator 15 detects a period To from an ON time of the transistor Q4 to an ON time of the transistor Q2. The voltage comparator 15 outputs a pulse signal $V_C$ which has a period Tf corresponding to the input FM signal and which includes a pulse signal having a constant width To. The pulse signal $V_C$ is output from an output terminal 16 through the low-pass filter LPF as a demodulated output.

A maximum frequency which can be demodulated by the FM demodulator while good linearity is a frequency at which the width of the pulse output from the voltage comparator 15 can no longer have the constant value To. That is, the maximum frequency demodulated while the pulse width To is assured is obtained when any one of periods $T_L$ and $T_H$ shown in FIGS. 6 and 7 is set to be "0". In a circuit shown in FIG. 5, the maximum frequency can be obtained when the period $T_H$ is set to be "0", as shown in FIG. 7.

In recent years, in order to improve picture quality in a VTR, a recording frequency is set to be high. However, in a conventional FM demodulator, a demodulation enable frequency cannot be easily increased while the linearity of input/output signal is assured.

DISCLOSURE OF THE INVENTION

It is an object of the present invention to provide an FM demodulator capable of increasing a demodulation enable frequency while the linearity of input/output signals is assured.

The present invention will be achieved by the following arrangement.

According to the present invention, there is provided an FM demodulator characterized by comprising a first differential amplifier for receiving an FM signal and a constant voltage, a second differential amplifier for receiving an FM signal having a phase opposite to that of the FM signal input to the first differential amplifier and a constant voltage, a first constant current circuit connected to a current output terminal of the first differential amplifier, a second constant current circuit connected to a current output terminal of the second differential amplifier and having a current value larger than that of the first constant current circuit, a capacitor connected between the current output terminals of the first and second differential amplifiers, detection means for detecting a period in which a current of the first constant current circuit flows through the capacitor, and smoothing means for smoothing a detection output from the detection means.

According to the present invention, the current value of the second constant current circuit connected to a current output terminal of the second differential amplifier is larger than the current value of the first constant current circuit connected to the current output terminal of the first differential amplifier so as to shorten recovery of charges accumulated in the capacitor. Therefore, the linearity of input/output signals is assured, and a demodulation enable frequency is increased.

BEST MODE OF CARRYING OUT THE INVENTION

Figure 1:
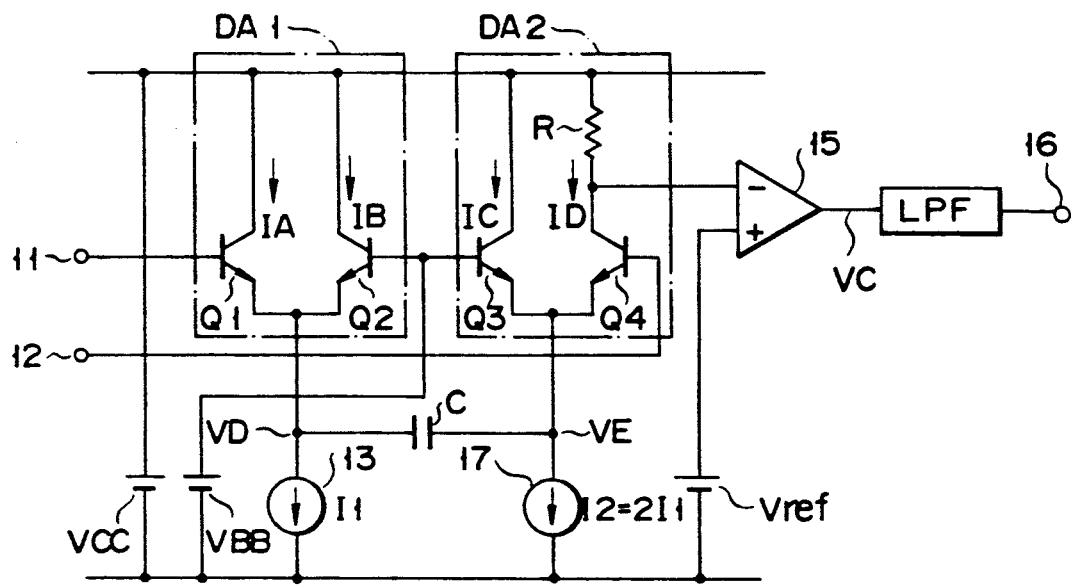
FIG. 1 is a circuit diagram showing an FM demodulator according to an embodiment of the present invention.

An embodiment of the present invention will be described below with reference to the accompanying drawings. The same reference numerals as in FIG. 1 denote the same parts in FIG. 5, and only different parts will be described below.

Figure 5:
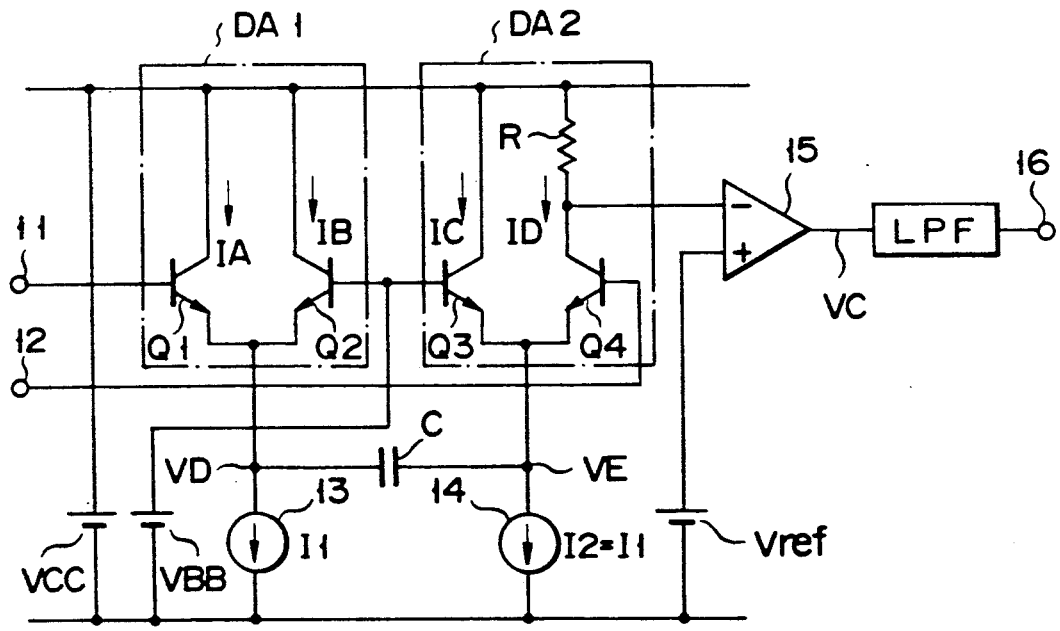
FIG. 5 is a circuit diagram showing the conventional FM demodulator.
Figure 7:
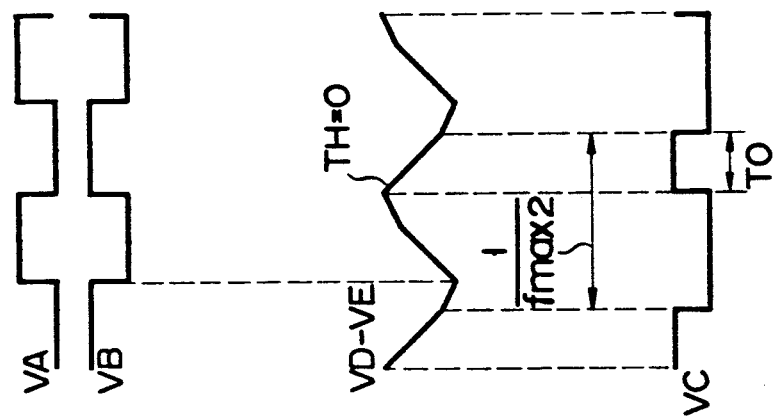
FIGS. 6 and 7 are charts for explaining an operation of the FM demodulator in FIG. 5.
Figure 6:
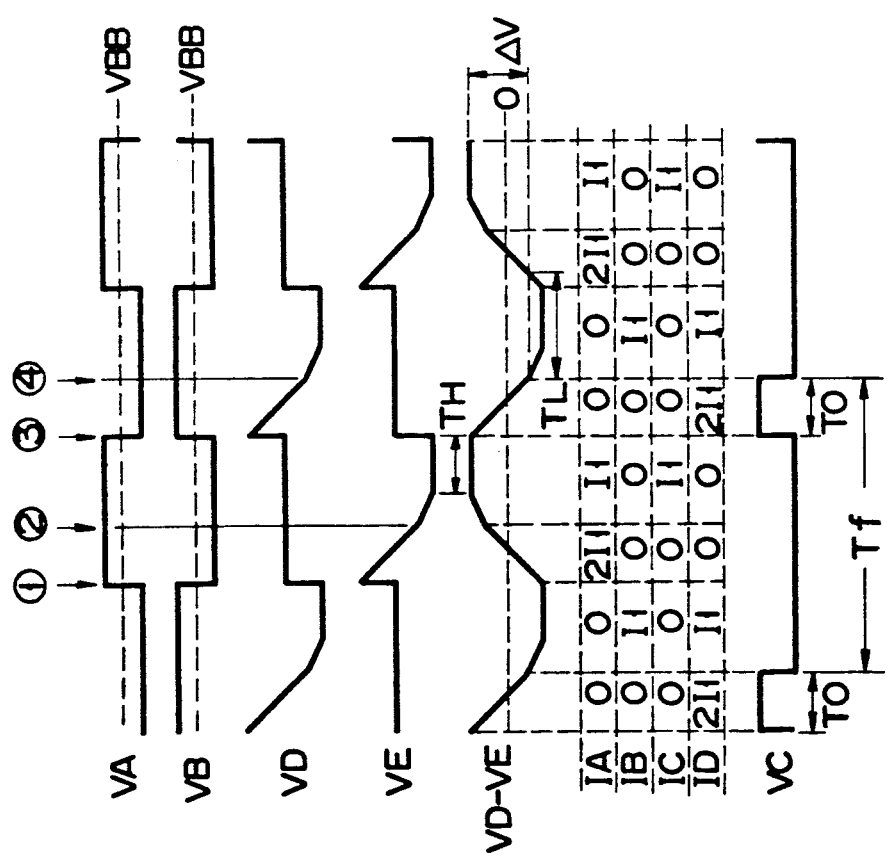

Referring to FIG. 1, a second constant current circuit 17 and a reference power source Vref are different from those in FIG. 5. The current value of the second constant current circuit 17 is set to be larger than that of a first constant current circuit 13. For example, in this embodiment, this value is set to satisfy an equation $I_2 = -2I_1$. The reference power source Vref is set to satisfy the following equation:

$$V_{ref} = V_{CC} - 2.5 RI_1$$

An operation of this circuit with the above arrangement will be described below with reference to FIG. 2.

Figure 2:
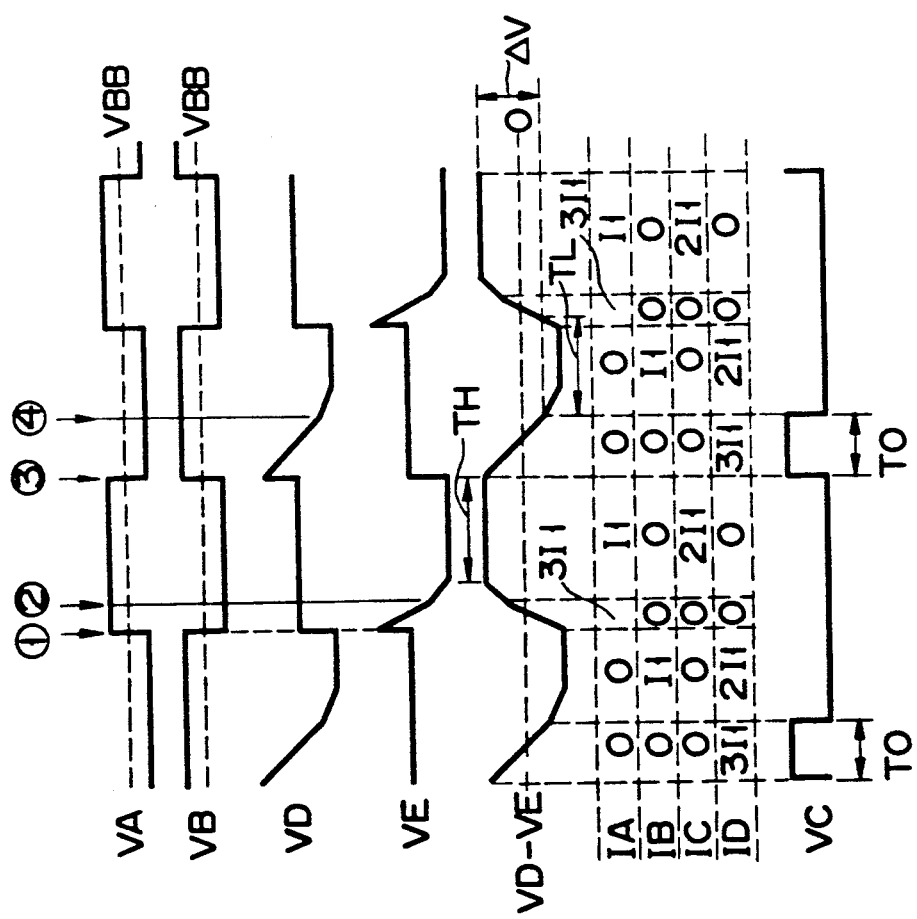

When an FM signal $V_A$ rises as indicated by ① in FIG. 2 and a transistor Q1 is turned on, a collector current ($I_A = 3I_1$) of the transistor Q1 flows through the first constant current circuit 13, a capacitor C, and the second constant current circuit 17.

When a voltage $V_E$ of the capacitor C becomes a voltage indicated by ② in FIG. 2, a transistor Q3 is turned on, and a collector current ($I_C = 2I_1$) of the transistor Q3 flows through the second constant current circuit 17, and the collector current ($I_A = I_1$) of the transistor Q1 flows through the first constant current circuit 13.

When an opposite-phase FM signal $V_B$ rises as indicated by ③ in FIG. 2 and a transistor Q4 is turned on, a collector current ($I_D = 3I_1$) of the transistor Q4 flows through the second constant current circuit 17, the capacitor C, and the first constant current circuit 13. When a voltage $V_D$ of the capacitor C becomes a voltage indicated by ④ in FIG. 2, a transistor Q2 is turned on, a collector current ($I_B = I_1$) of the transistor Q2 flows through the first constant current circuit 13, and the collector current ($I_D = 2I_1$) of the transistor Q4 flows through the second constant current circuit 17.

A pulse signal To having a constant width and detected by a voltage comparator 15 is determined by a difference voltage $\Delta V$ of the capacitor C and a current value $I_1$ of the first constant current circuit 13, i.e., the following equation is satisfied:

$$T_o = C \cdot \Delta V / I_1$$

Figure 3:
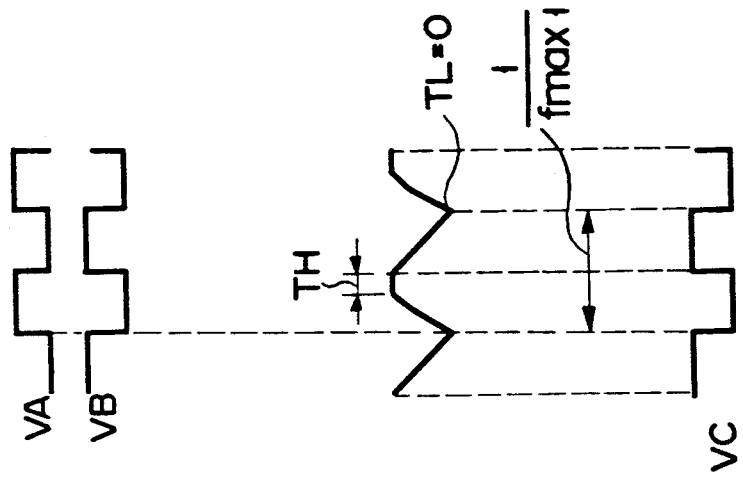
FIGS. 2 and 3 are charts for explaining an operation of the FM demodulator in FIG. 1.

According to the above embodiment, the current value of the second constant current circuit 17 is set to be larger than that of the first constant current circuit 13. For this reason, a recovery time of charges charged in the capacitor C can be shortened compared with a conventional circuit. Therefore, a frequency of the input FM signal is increased, a condition of limit for inhibiting the width of the pulse output from the voltage comparator 15 to have the constant value To, i.e., a maximum demodulation enable frequency keeping good linearity, is obtained when a value $T_L$ is set to be "0" as shown in FIGS. 2 and 3, in this embodiment. When the value $T_L$ is set as described above, the maximum demodulation enable frequency can be increased compared with a conventional demodulator.

Figure 4:
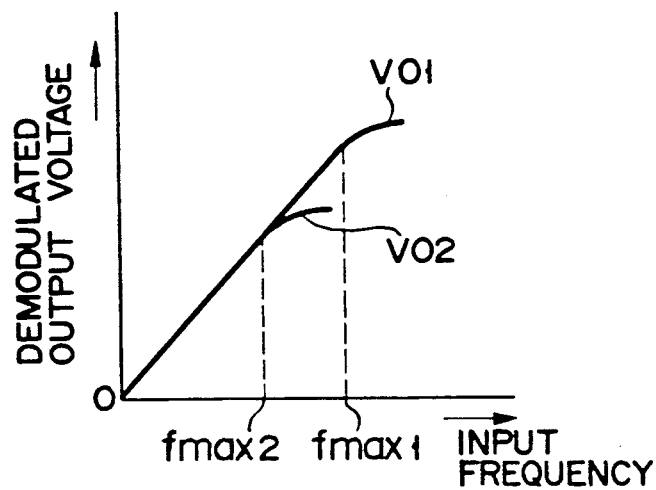
FIG. 4 is a graph showing demodulated output voltages of a conventional FM demodulator and the FM demodulator according to this embodiment.

FIG. 4 shows a demodulated output voltage of the circuits shown in FIGS. 1 and 5. A demodulated output voltage $V_{01}$ in FIG. 1 has better linearity and a maximum demodulation enable frequency higher than a demodulated output voltage $V_{02}$ in FIG. 5.

Although the current value of the second current circuit 17 is set to be $2I_1$ in the above embodiment, the current value is not limited to this value.

Various modifications can be made without departing from the spirit and scope of the invention.

INDUSTRIAL APPLICABILITY

As described above, according to the present invention, the linearity of input/output voltages is assured, and a demodulation enable frequency can be increased. Therefore, the FM demodulator can be probably utilized for demodulating a reproduction signal in a VTR.

I claim:

1. An FM demodulator characterized by comprising:
   a first differential amplifier for receiving an FM signal and a constant voltage;
   a second differential amplifier for receiving an FM signal having a phase opposite to that of the FM signal input to said first differential amplifier and a constant voltage;
   a first constant current circuit connected to a current output terminal of the first differential amplifier;
   a second constant current circuit connected to a current output terminal of said second differential amplifier and having a current value larger than that of said first constant current circuit;
   a capacitor connected between the current output terminals of said first and second differential amplifiers;
   detection means for detecting a period in which a current of said first constant current circuit flows through said capacitor; and
   smoothing means for smoothing a detection output from said detection means.

2. An FM demodulator according to claim 1, characterized in that said second constant current circuit has a current amount twice a current amount of said first constant current circuit.

3. An FM demodulator according to claim 1, characterized in that said smoothing means is constituted by a low-pass filter.

4. An FM demodulator characterized by comprising:

a first differential amplifier including first and second transistors, said first transistor having a base for receiving an FM signal and said second transistor having a base for receiving a constant voltage;

a second differential amplifier including third and fourth transistors, said third transistor having a base for receiving a constant voltage and said fourth transistor having a base for receiving an FM signal having a phase opposite to the FM signal input to said first transistor;

a first constant current circuit connected to emitters of said first and second transistors;

a second constant current circuit connected to emitters of said third and fourth transistors and having a current value larger than that of said first constant current circuit;

a capacitor connected between the emitters of said first and second transistors and the emitters of said third and fourth transistors;

detection means for detecting a period in which a current of said first constant current circuit flows in said capacitor by an output current from said fourth transistor; and smoothing means for smoothing a detection output from said detection means.

5. An FM demodulator according to claim 4, characterized in that said second constant current circuit has a current amount twice a current amount of said first constant current circuit.

6. An FM demodulator according to claim 4, characterized in that said detection means is constituted by a voltage comparator having an inverting input terminal connected to a collector of said fourth transistor and a non-inverting terminal connected to a reference voltage.

7. An FM demodulator according to claim 4, characterized in that said smoothing means is constituted by a low-pass filter.

8. An FM demodulator characterized by comprising:

a first differential amplifier including first and second transistors, said first transistor having a base for receiving an FM signal and said second transistor having a base for receiving a constant voltage;

a second differential amplifier including third and fourth transistors, said third transistor having a base for receiving a constant voltage and said fourth transistor having a base for receiving an FM signal having a phase opposite to the FM signal input to said first transistor;

a first constant current circuit connected to emitters of said first and second transistors;

a second constant current circuit connected to emitters of said third and fourth transistors and having a current value twice that of said first constant current circuit;

a capacitor connected between the emitters of said first and second transistors and the emitters of said third and fourth transistors;

detection means connected to a collector of said fourth transistor, for detecting a period in which a current of said first constant current flows in said capacitor; and a low-pass filter for smoothing a detection output from said detection means.

9. An FM demodulator according to claim 8, characterized in that said detection means detects a period in which a current having a value three times that of said first constant current circuit flows in said capacitor.

* * * * *